US012812973B2

(12) United States Patent
Li et al.

(10) Patent No.: US 12,812,973 B2
(45) Date of Patent: Nov. 24, 2026

(54) ARRAY SUBSTRATE AND TOUCH DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Feng Li, Beijing (CN); Jiabin Zou, Beijing (CN); Na Wen, Beijing (CN); Cuicui Zheng, Beijing (CN); Qi Sang, Beijing (CN); Yan Yan, Beijing (CN); Xiaofeng Yin, Beijing (CN); Yu Ma, Beijing (CN); Weitao Chen, Beijing (CN); Jing Wang, Beijing (CN)

(73) Assignees: BEIJING BOE DISPLAY TECHNOLOGY CO., LTD., Beijing (CN); Beijing BOE Technology Development Co., Ltd., Beijing (CN)

( * ) Notice: Subject to any disclaimer, the term of this patent is extended or adjusted under 35 U.S.C. 154(b) by 373 days.

(21) Appl. No.: 18/579,794

(22) PCT Filed: Oct. 31, 2022

(86) PCT No.: PCT/CN2022/128764

§ 371 (c)(1),
(2) Date: Jan. 16, 2024

(87) PCT Pub. No.: WO2024/092454

PCT Pub. Date: May 10, 2024

(65) Prior Publication Data

US 2025/0133825 A1 Apr. 24, 2025

(51) Int. Cl.
*G06F 3/041* (2006.01)
*H10D 86/40* (2025.01)
*H10D 86/60* (2025.01)

(52) U.S. Cl.
CPC ......... *H10D 86/441* (2025.01); *G06F 3/0412* (2013.01); *H10D 86/60* (2025.01)

(58) Field of Classification Search
CPC ..................................................... G06F 3/0412
See application file for complete search history.

(56) References Cited

U.S. PATENT DOCUMENTS 10,629,634 B1 * 4/2020 Liao .................. G02F 1/134336
2017/0047347 A1 2/2017 Kim et al.
(Continued)

FOREIGN PATENT DOCUMENTS

CN 107037646 A 8/2017
CN 108415601 A 8/2018
(Continued)

OTHER PUBLICATIONS

International Search Report received for PCT Patent Application No. PCT/CN2022/128764, mailed on Jul. 26, 2023, 7 pages (3 pages of English Translation and 2 pages of Original Document).

*Primary Examiner* — Nan-Ying Yang
(74) *Attorney, Agent, or Firm* — Myers Bigel, P.A.

(57) ABSTRACT

The disclosure provides an array substrate and a touch display device. The array substrate includes a display area and a non-display area, and the non-display area includes a fan-out area and a signal input area. The display area is provided with a plurality of display data lines and a plurality of touch data lines, the fan-out area is provided with a plurality of display data fan-out lines and a plurality of touch data fan-out lines, the fan-out area includes a first part and a second part which are adjacently distributed in a direction from the display area to the signal input area. In the first part of the fan-out area, each display data fan-out line includes a first display data fan-out line segment connected with a corresponding display data line, each touch data fan-out line includes a first touch data fan-out line segment connected
(Continued)

with a corresponding touch data line, the first display data fan-out line segment is in a first conductive layer, and the first touch data fan-out line segment is in a second conductive layer electrically insulated from the first conductive layer.

24 Claims, 9 Drawing Sheets

(56) References Cited

U.S. PATENT DOCUMENTS

| | | | | |
|---|---|---|---|---|
| 2018/0330653 | A1* | 11/2018 | Zhou | G02F 1/13452 |
| 2019/0212855 | A1 | 7/2019 | Shang | |
| 2019/0278455 | A1* | 9/2019 | Li | G09G 3/20 |
| 2020/0019294 | A1 | 1/2020 | Lee et al. | |
| 2021/0005699 | A1 | 1/2021 | Lee et al. | |
| 2021/0055616 | A1* | 2/2021 | Hsu | G02F 1/1345 |
| 2021/0124206 | A1* | 4/2021 | Li | G02F 1/13338 |
| 2021/0200406 | A1 | 7/2021 | Lee et al. | |
| 2021/0357094 | A1 | 11/2021 | Qiao et al. | |
| 2023/0116089 | A1 | 4/2023 | Hsu et al. | |

FOREIGN PATENT DOCUMENTS

| | | | |
|---|---|---|---|
| CN | 108681415 | A | 10/2018 |
| CN | 108732837 | A | 11/2018 |
| CN | 109491121 | A | 3/2019 |
| CN | 110416230 | A | 11/2019 |
| CN | 110727368 | A | 1/2020 |
| CN | 112051691 | A | 12/2020 |
| CN | 112185999 | A | 1/2021 |
| CN | 112415817 | A | 2/2021 |
| CN | 113126805 | A | 7/2021 |

* cited by examiner

ARRAY SUBSTRATE AND TOUCH DISPLAY DEVICE

RELATED APPLICATIONS

The present application is a 35 U.S.C. 371 national stage application of PCT International Application No. PCT/CN2022/128764, filed on Oct. 31, 2022, the entire disclosure of which is incorporated herein by reference.

TECHNICAL FIELD

The present disclosure relates to the field of the display technology, in particular to an array substrate and a touch display device comprising the array substrate.

BACKGROUND

Touch and display driver integration (TDDI) technology has been widely used in products such as mobile phones, tablet computers, desktop displays. With the equal quality trend of products becoming more and more serious, narrow borders, as one of the core competitiveness of products, can effectively enhance the added value of products. The layout of the fan-out area of TDDI products will directly affect the size of the bottom border of the products. How to reduce the bottom border through reasonable layout of the fan-out area is particularly important.

SUMMARY

According to an aspect of the disclosure, an array substrate is provided, which comprises a display area and a non-display area at least partially surrounding the display area, the non-display area comprising a fan-out area and a signal input area, and the fan-out area being between the display area and the signal input area, wherein the display area is provided with a plurality of display data lines and a plurality of touch data lines, the fan-out area is provided with a plurality of display data fan-out lines and a plurality of touch data fan-out lines, each display data fan-out line is connected with a corresponding display data line, and each touch data fan-out line is connected with a corresponding touch data line; and wherein the fan-out area comprises a first part and a second part which are adjacently distributed in a direction from the display area to the signal input area, in the first part of the fan-out area, each display data fan-out line comprises a first display data fan-out line segment connected with a corresponding display data line, each touch data fan-out line comprises a first touch data fan-out line segment connected with a corresponding touch data line, the first display data fan-out line segment is in a first conductive layer, and the first touch data fan-out line segment is in a second conductive layer electrically insulated from the first conductive layer.

In some embodiments, wherein in the display area, the plurality of display data lines and the plurality of touch data lines are in the second conductive layer.

In some embodiments, the array substrate further comprises a substrate, wherein the first conductive layer is arranged on the substrate, the second conductive layer is on a side of the first conductive layer facing away from the substrate, and the array substrate further comprises a first insulating layer between the first conductive layer and the second conductive layer, and a second insulating layer covering the second conductive layer and the first insulating layer, wherein each first display data fan-out line segment in the first conductive layer is electrically connected to a corresponding display data line in the second conductive layer through a fifth connecting part, one end of the fifth connecting part is connected with the first display data fan-out line segment through at least one ninth via hole penetrating the first insulating layer and the second insulating layer, and the other end of the fifth connecting part is connected with the display data line through at least one tenth via hole penetrating the second insulating layer, and wherein each first touch data fan-out line segment in the second conductive layer is integrally connected with a corresponding touch data line in a same layer.

In some embodiments, wherein each first display data fan-out line segment in the first conductive layer comprises a ninth widening portion, the corresponding display data line in the second conductive layer comprises a tenth widening portion, an orthographic projection of the at least one ninth via hole on the substrate is within an orthographic projection of the ninth widening portion on the substrate, and an orthographic projection of the at least one tenth via hole on the substrate is within an orthographic projection of the tenth widening portion on the substrate.

In some embodiments, wherein in the second part of the fan-out area, each display data fan-out line comprises a second display data fan-out line segment electrically connected with the first display data fan-out line segment, each touch data fan-out line comprises a second touch data fan-out line segment electrically connected with the first touch data fan-out line segment, the second part of the fan-out area comprises a first wiring area, a plurality of first wiring groups are arranged in the first wiring area, each first wiring group comprises a plurality of second display data fan-out line segments and at least one second touch data fan-out line segment, wherein the at least one second touch data fan-out line segment is in the second conductive layer, some of the plurality of second display data fan-out line segments are in the first conductive layer, and others of the plurality of second display data fan-out line segments are in the second conductive layer.

In some embodiments, wherein the second display data fan-out line segment or the second touch data fan-out line segment in the second conductive layer overlaps or is alternately arranged with the corresponding second display data fan-out line segment in the first conductive layer.

In some embodiments, the array substrate further comprises a substrate, wherein the first conductive layer is arranged on the substrate, and the second conductive layer is on a side of the first conductive layer facing away from the substrate, and the array substrate further comprises a first insulating layer between the first conductive layer and the second conductive layer, and a second insulating layer covering the second conductive layer and the first insulating layer, wherein each second display data fan-out line segment in the second conductive layer is electrically connected to a corresponding first display data fan-out line segment in the first conductive layer through a first connecting part, one end of the first connecting part is connected with the second display data fan-out line segment through at least one first via hole penetrating the second insulating layer, and the other end of the first connecting part is connected with the first display data fan-out line segment through at least one second via hole penetrating the first insulating layer and the second insulating layer.

In some embodiments, wherein each second display data fan-out line segment in the second conductive layer comprises a first widening portion, a corresponding first display data fan-out line segment in the first conductive layer comprises a second widening portion, an orthographic projection of the at least one first via hole on the substrate is within an orthographic projection of the first widening portion on the substrate, and an orthographic projection of the at least one second via hole on the substrate is within an orthographic projection of the second widening portion on the substrate.

In some embodiments, wherein each second display data fan-out line segment in the first conductive layer is electrically connected to a corresponding first display data fan-out line segment in the first conductive layer through a second connecting part, one end of the second connecting part is connected with the second display data fan-out line segment through at least one third via hole penetrating the first insulating layer and the second insulating layer, and the other end of the second connecting part is connected with the first display data fan-out line segment through at least one fourth via hole penetrating the first insulating layer and the second insulating layer.

In some embodiments, wherein each second display data fan-out line segment in the first conductive layer comprises a third widening portion, the corresponding first display data fan-out line segment in the first conductive layer comprises a fourth widening portion, an orthographic projection of the at least one third via hole on the substrate is within an orthographic projection of the third widening portion on the substrate, and an orthographic projection of the at least one fourth via hole on the substrate is within an orthographic projection of the fourth widening portion on the substrate.

In some embodiments, wherein the second part of the fan-out area further comprises a second wiring area arranged adjacent to the first wiring area, a plurality of second wiring groups are arranged in the second wiring area, and each second wiring group comprises at least two second touch data fan-out line segments.

In some embodiments, wherein two second touch data fan-out line segments in each second wiring group are in the second conductive layer.

In some embodiments, wherein each second touch data fan-out line segment is integrally connected with a corresponding first touch data fan-out line segment in a same layer.

In some embodiments, wherein two second touch data fan-out line segments of each second wiring group are overlapped or alternately arranged in the first conductive layer and the second conductive layer.

In some embodiments, wherein each second touch data fan-out line segment in the first conductive layer is electrically connected to a corresponding first touch data fan-out line segment in the second conductive layer through a third connecting part, one end of the third connecting part is connected with the second touch data fan-out line segment through at least one fifth via hole penetrating the first insulating layer and the second insulating layer, and the other end of the third connecting part is connected with the first touch data fan-out line segment through at least one sixth via hole penetrating the second insulating layer.

In some embodiments, wherein each second touch data fan-out line segment in the first conductive layer comprises a fifth widening portion, the corresponding first touch data fan-out line segment in the second conductive layer comprises a sixth widening portion, an orthographic projection of the at least one fifth via hole on the substrate is within an orthographic projection of the fifth widening portion on the substrate, and an orthographic projection of the at least one sixth via hole on the substrate is within an orthographic projection of the sixth widening portion on the substrate.

In some embodiments, wherein each second touch data fan-out line segment in the second conductive layer is electrically connected to a corresponding first touch data fan-out line segment in the second conductive layer through a fourth connecting part, one end of the fourth connecting part is connected with the second touch data fan-out line segment through at least one seventh via hole penetrating the second insulating layer, and the other end of the fourth connecting part is connected with the first touch data fan-out line segment through at least one eighth via hole penetrating the second insulating layer.

In some embodiments, wherein each second touch data fan-out line segment in the second conductive layer comprises a seventh widening portion, the corresponding first touch data fan-out line segment in the second conductive layer comprises an eighth widening portion, an orthographic projection of the at least one seventh via hole on the substrate is within an orthographic projection of the seventh widening portion on the substrate, and an orthographic projection of the at least one eighth via hole on the substrate is within an orthographic projection of the eighth widening portion on the substrate.

In some embodiments, the array substrate further comprises a common electrode, wherein the first connecting part, the second connecting part, the third connecting part, the fourth connecting part and the fifth connecting part are made in a same process as the common electrode.

In some embodiments, the array substrate further comprises a pixel electrode, wherein the first connecting part, the second connecting part, the third connecting part, the fourth connecting part and the fifth connecting part are made in a same process as the pixel electrode.

In some embodiments, wherein a plurality of display signal input lines and a plurality of touch signal input lines are arranged in the signal input area, each display signal input line is connected with a corresponding display data fan-out line, and each touch signal input line is connected with a corresponding touch data fan-out line.

In some embodiments, wherein each display signal input line is integrally connected with the second display data fan-out line segment of the corresponding display data fan-out line in a same layer, and each touch signal input line is integrally connected with the second touch data fan-out line segment of the corresponding touch data fan-out line in a same layer.

In some embodiments, wherein each display signal input line comprises a first bonding terminal, each touch signal input line comprises a second bonding terminal, and orthographic projections of each first bonding terminal and each second bonding terminal on the substrate do not overlap each other.

In some embodiments, wherein the first conductive layer is a gate layer and the second conductive layer is a source-drain layer.

According to another aspect of the present disclosure, a touch display device is provided, which comprises any of the aforementioned array substrates and a control chip, wherein pins of the control chip are connected with corresponding first bonding terminals and second bonding terminals in the signal input area.

BRIEF DESCRIPTION OF THE DRAWINGS

In order to more clearly illustrate the technical solutions in embodiments of the disclosure, the drawings needed to be used in the description of the embodiments will be introduced briefly in the following. Obviously, the drawings in the following description are only some embodiments of the disclosure, and for those of ordinary skills in the art, other drawings may be obtained according to these drawings under the premise of not paying out creative work.

DETAILED DESCRIPTION OF THE DISCLOSURE

Figure 1:
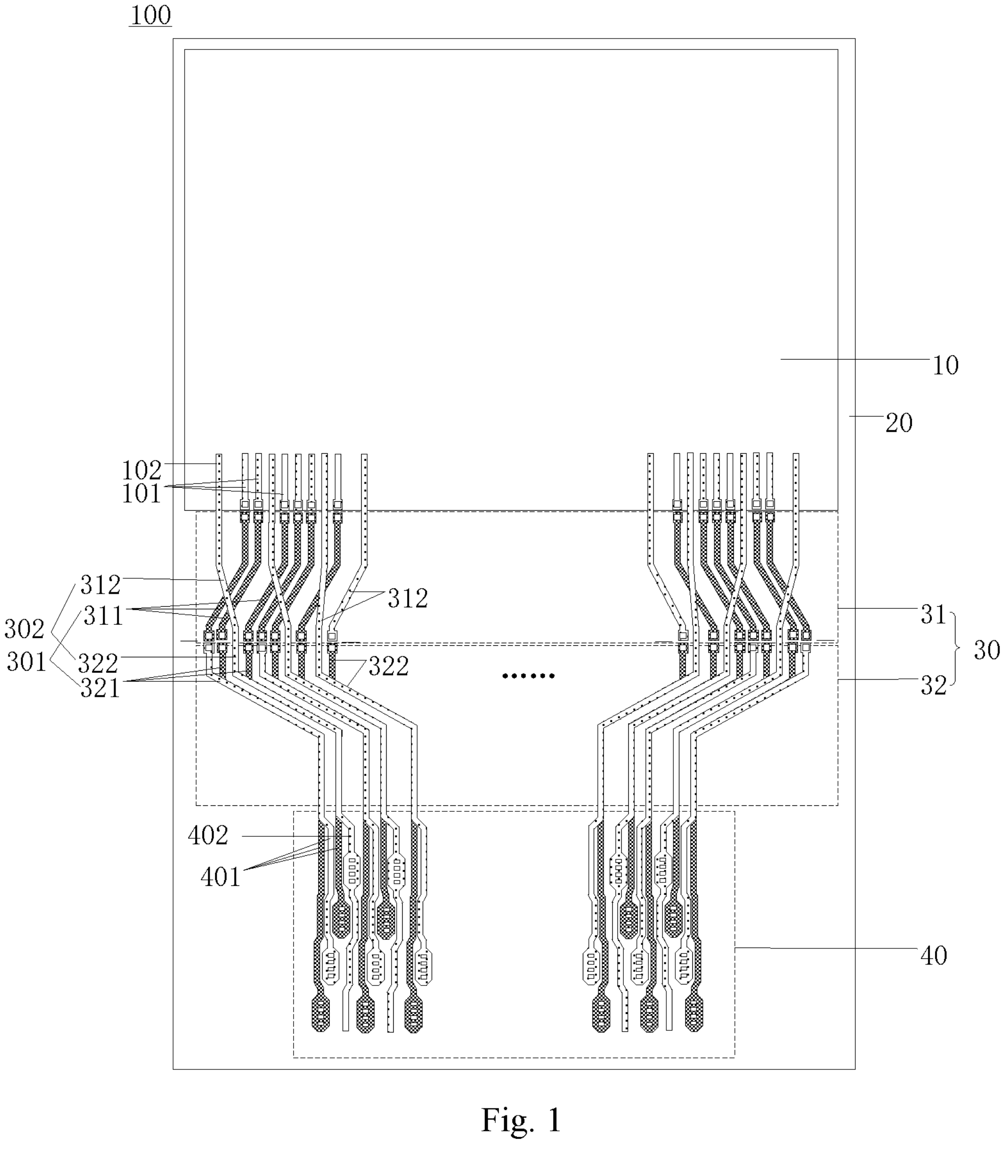
FIG. 1 shows a schematic structural diagram of an array substrate provided according to an embodiment of the present disclosure.

In order to make the objectives, technical solutions, and advantages of the present disclosure more clear, the present disclosure will be described in further detail below with reference to the accompanying drawings. Obviously, the described embodiments are only a part of the embodiments of the present disclosure, but not all the embodiments. Based on the embodiments in the present disclosure, all other embodiments obtained by a person having ordinary skill in the art without making creative efforts fall within the protection scope of the present disclosure.

It can be understood that the drawings in the embodiment of the present disclosure are only used to schematically show the connection relationship between various components, and the dimensions of various components in the drawings are not drawn to scale, and their relative position relationship does not necessarily correspond to the actual position. In the drawings, the proportions of some regions and layers may be exaggerated for clarity.

With the continuous development of display technology, in order to make users get better visual experience, higher requirements are put forward for the screen ratio of display devices, which requires the display devices to have narrower borders. In conventional TDDI products, touch signal lines and display signal lines are usually arranged in separate conductive layers. Since the number of display signal lines is usually more than that of touch signal lines, the bottom border of conventional TDDI products is determined by the wiring space of display signal lines, and the display signal lines arranged in a single layer lead to a large bottom border.

An embodiment of the present disclosure provides an array substrate, and FIG. 1 shows a structural schematic diagram of the array substrate 100. As shown in FIG. 1, the array substrate 100 includes a display area 10 and a non-display area 20 at least partially surrounding the display area. The non-display area 20 includes a fan-out area 30 and a signal input area 40, and the fan-out area 30 is between the display area 10 and the signal input area 40. The display area 10 is provided with a plurality of display data lines 101 and a plurality of touch data lines 102, the fan-out area 30 is provided with a plurality of display data fan-out lines 301 and a plurality of touch data fan-out lines 302, each display data fan-out line 301 is connected with a corresponding display data line 101, and each touch data fan-out line 302 is connected with a corresponding touch data line 102. As shown in FIG. 1, the fan-out area 30 includes a first part 31 and a second part 32 which are adjacently distributed in a direction from the display area 10 to the signal input area 40. In the first part 31 of the fan-out area, each display data fan-out line 301 includes a first display data fan-out line segment 311 connected to the corresponding display data line 101, and each touch data fan-out line 302 includes a first touch data fan-out line segment 312 connected to the corresponding touch data line 102. The first display data fan-out line segment 311 is in a first conductive layer, and the first touch data fan-out line segment 312 is in a second conductive layer electrically insulated from the first conductive layer.

It should be noted that in the drawings of this application, different conductive layers are schematically represented by different filling patterns, in which the darker color pattern represents the first conductive layer and the lighter color pattern represents the second conductive layer. Only a part of the wiring structure is schematically shown in FIG. 1, and the arrangement order, spacing and length of the display data lines and the touch data lines in the display area are also schematic, which does not represent the limitation of this application.

Although the first conductive layer is below the second conductive layer in FIG. 1, this does not mean that the application is limited, that is, the positions of the first conductive layer and the second conductive layer are not limited, as long as the first display data fan-out line segment 311 and the first touch data fan-out line segment 312 are in two conductive layers which are electrically insulated from each other. The first conductive layer or the second conductive layer can reuse the gate layer or the source-drain layer of the array substrate, and can also be another conductive layer specially used for arranging display data lines and touch data lines.

According to the array substrate provided by the embodiment of the application, in the first part of fan-out area, all the first display data fan-out line segments are in the first conductive layer, and all the first touch data fan-out line segments are in the second conductive layer. This ensures that all the first touch data fan-out line segments are located at a same layer, and prevents the critical dimension difference between two adjacent first touch data fan-out line segments from being large due to process fluctuation of different layers, thereby avoiding the problem that the resistance difference between adjacent first touch data fan-out line segments is too large.

Figure 2:
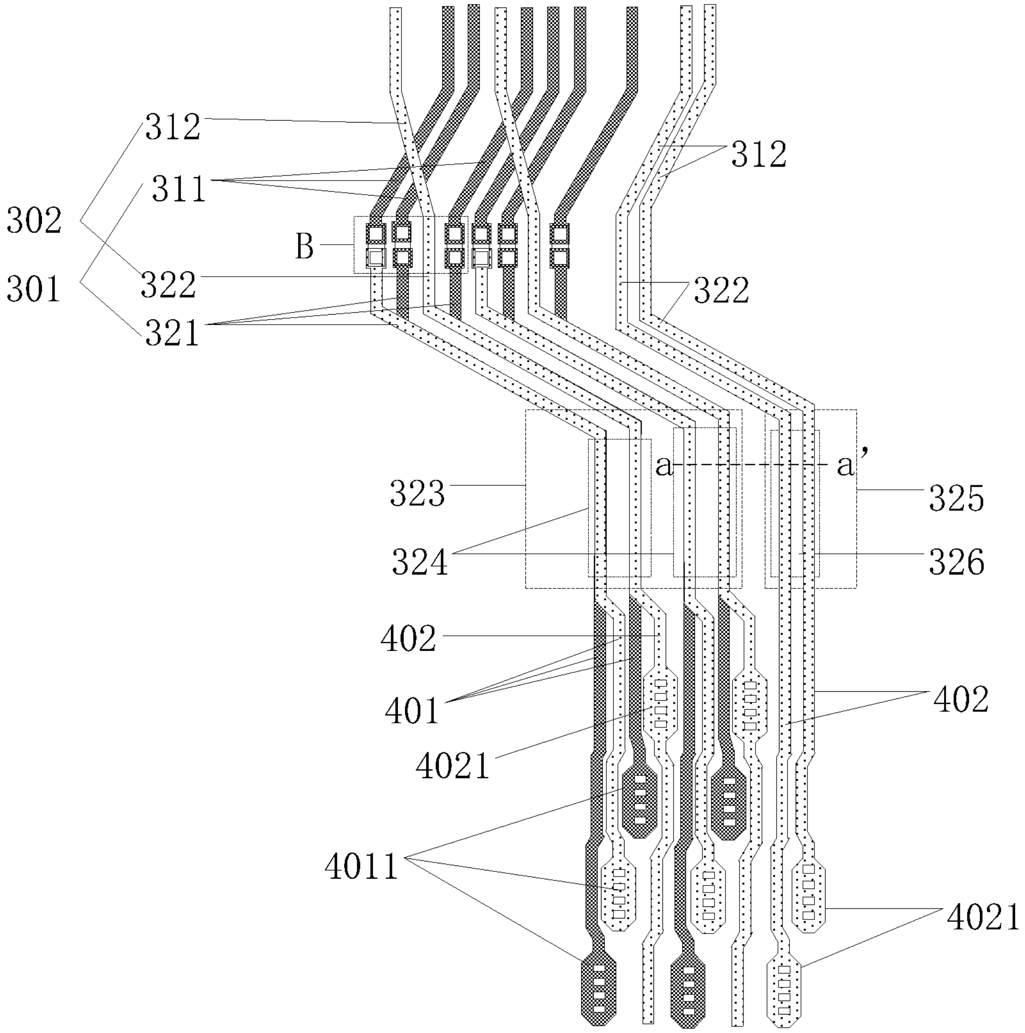
FIG. 2 shows a schematic diagram of a part of wiring area of an array substrate provided according to an embodiment of the present disclosure.
Figure 4:
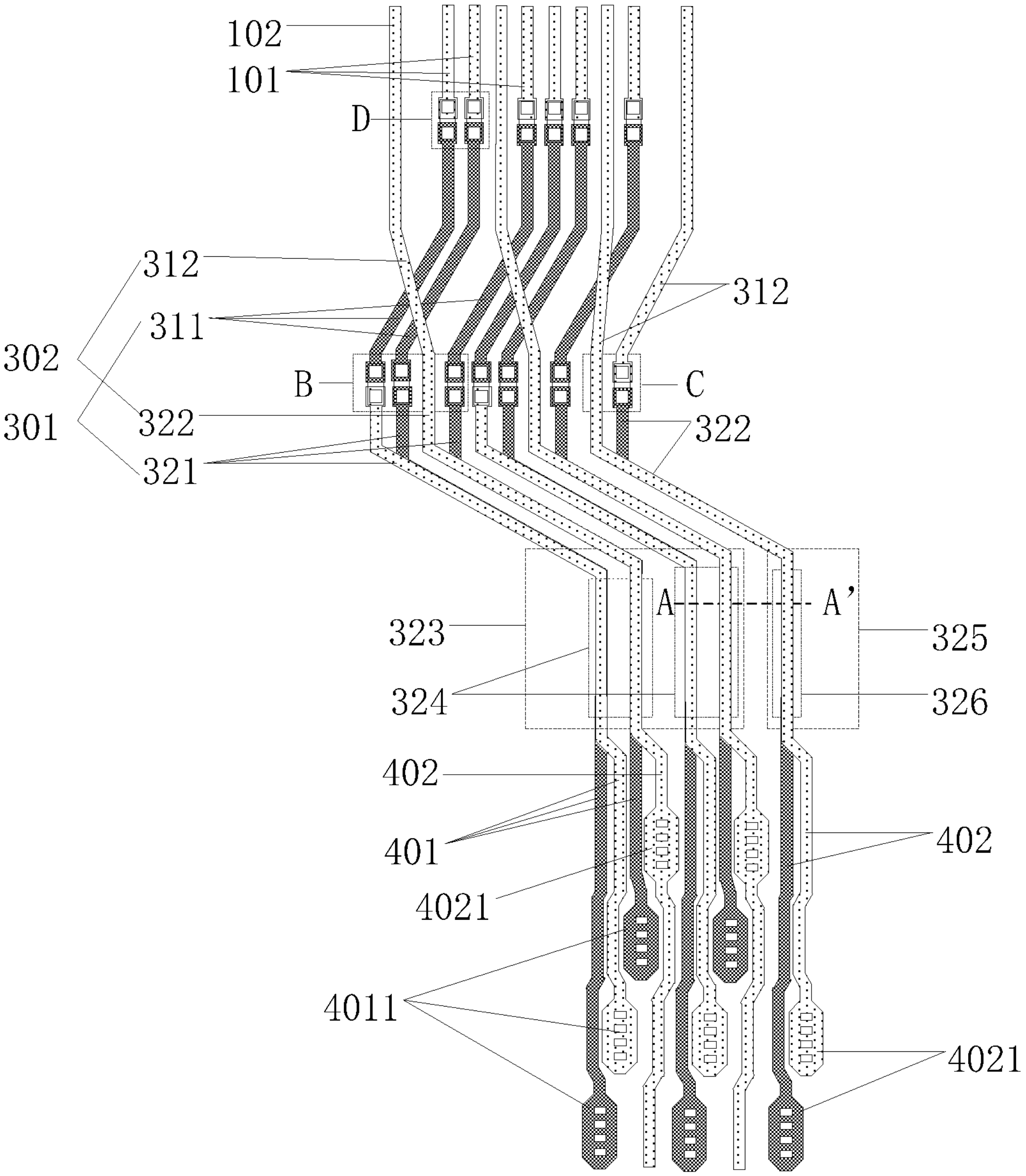
FIG. 4 shows a schematic diagram of a part of a wiring area of an array substrate provided according to another embodiment of the present disclosure.

FIG. 2 and FIG. 4 show schematic top views of a part of a wiring area according to two embodiments of the present application. As shown in FIG. 2 and FIG. 4, in the second part of the fan-out area, each display data fan-out line 301 includes a second display data fan-out line segment 321 electrically connected with the first display data fan-out line segment 311, each touch data fan-out line 302 includes a second touch data fan-out line segment 322 electrically connected with the first touch data fan-out line segment 312. The second part of the fan-out area includes a first wiring area 323, a plurality of first wiring groups 324 are arranged in the first wiring area 323, and each first wiring group 324 includes a plurality of second display data fan-out line segments 321 and at least one second touch data fan-out line segment 322, the at least one second touch data fan-out line segment 322 is in the second conductive layer, some of the plurality of second display data fan-out line segments 321 are in the first conductive layer, and others of the plurality of second display data fan-out line segments are in the second conductive layer. By arranging the lines in two layers, the space occupied by the lines in the fan-out area can be effectively reduced, thereby effectively reducing the size of the bottom border of the product.

In a specific embodiment, the second display data fan-out line segment or the second touch data fan-out line segment in the second conductive layer may overlap or be alternately arranged with the corresponding second display data fan-out line segment in the first conductive layer. It should be noted that the word "alternately" in this application means that there is no overlap in the orthogonal projections of the lines in the two conductive layers on the substrate. By arranging the display data lines and the touch data lines in two conductive layers alternately, the mutual coupling between the two layers of lines can be effectively reduced. The word "overlap" in this application means that there is a certain degree of overlap in the orthogonal projections of the lines in the two conductive layers on the substrate. By overlapping the display data lines and the touch data lines in the two conductive layers, the space occupied by the lines in the fan-out area can be effectively reduced, thereby effectively reducing the size of the bottom border of the product.

Figure 3:
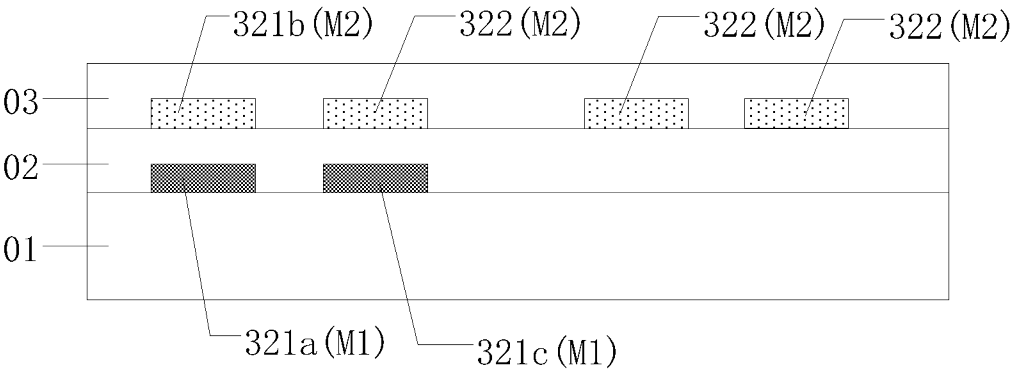
FIG. 3 shows a cross-sectional view of the array substrate in FIG. 2 along a-a' direction provided according to an embodiment of the present disclosure.
Figure 5:
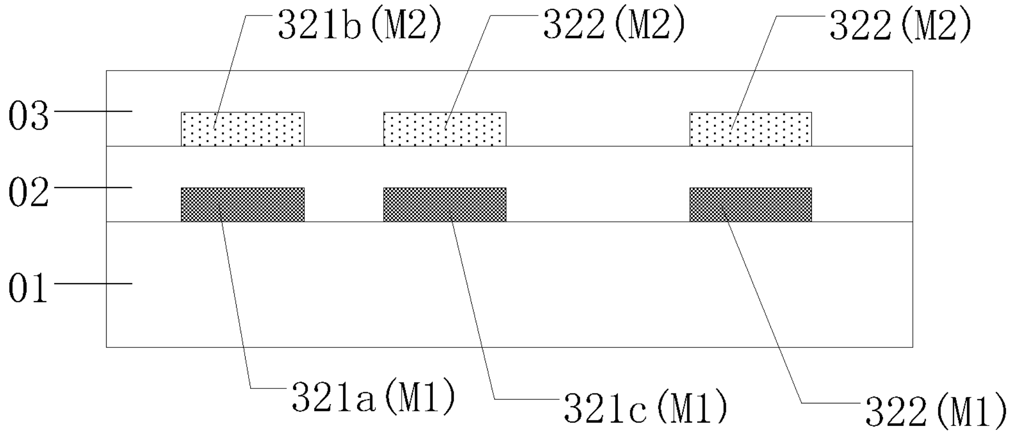
FIG. 5 shows a cross-sectional view of the array substrate in FIG. 4 along A-A' direction provided according to an embodiment of the present disclosure.

Only two first wiring groups 324 in the first wiring area 323 are schematically shown in FIG. 2 and FIG. 4. FIG. 3 shows a cross-sectional view along a-a' direction in FIG. 2, and FIG. 5 shows a cross-sectional view along A-A' direction in FIG. 4. As shown in FIGS. 2-5, each first wiring group 324 may include three second display data fan-out line segments 321*a*, 321*b*, and 321*c*, and one second touch data fan-out line segment 322, second touch data fan-out line segment 322 is in the second conductive layer M2, two second display data fan-out line segments 321*a*, 321*c* are in the first conductive layer M1, and one second display data fan-out line segment 321*b* is in the second conductive layer M2. The second display data fan-out line segment 321*b* in the second conductive layer M2 is overlapped with the corresponding second display data fan-out line segment 321*a* in the first conductive layer M1, and the second touch data fan-out line segment 322 in the second conductive layer M2 is overlapped with the corresponding second display data fan-out line segment 321*c* in the first conductive layer M1. Illustratively, the second display data fan-out line segment 321*a* may be a display data line that controls a green sub-pixel, the second display data fan-out line segment 321*b* may be a display data line that controls a red sub-pixel, and the second display data fan-out line segment 321*c* may be a display data line that controls a blue sub-pixel.

In the first wiring group shown in FIGS. 2-5, the orthographic projection of the second display data fan-out line segment 321*b* in the second conductive layer M2 on the substrate 01 coincides with the orthographic projection of the corresponding second display data fan-out line segment 321*a* in the first conductive layer M1, and the orthographic projection of the second touch data fan-out line segment 322 in the second conductive layer M2 on the substrate 01 coincides with the orthographic projection of the corresponding second display data fan-out line segment 321*c* in the first conductive layer M1 on the substrate 01, this arrangement can significantly reduce the space occupied by the lines in the fan-out area, thus significantly reducing the size of the bottom frame of the product.

It should be noted that, even in the embodiment in which the lines in the first wiring group are arranged in an overlapping manner between the first conductive layer and the second conductive layer, in order to facilitate the layered arrangement of the display data lines and the touch data lines in the first part of the fan-out area, the orthogonal projections of the lines in the two conductive layers on the substrate are not overlapped in the area of second part of the fan-out area closest to the first part of the fan-out area. As shown in FIG. 2 and FIG. 4, in the area of the second part of the fan-out area adjacent to block B and block C, the orthogonal projections of the lines in the two conductive layers on the substrate are not overlapped.

Figure 6:
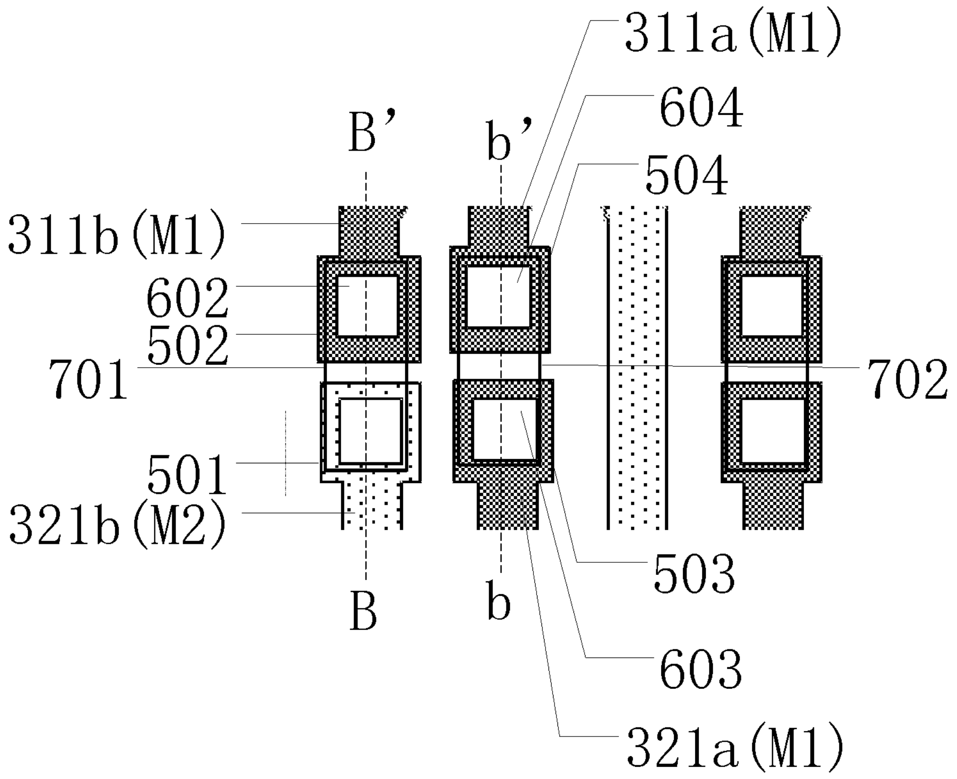
FIG. 6 shows an enlarged view of area B in FIG. 4 provided according to an embodiment of the present disclosure.
Figure 8:
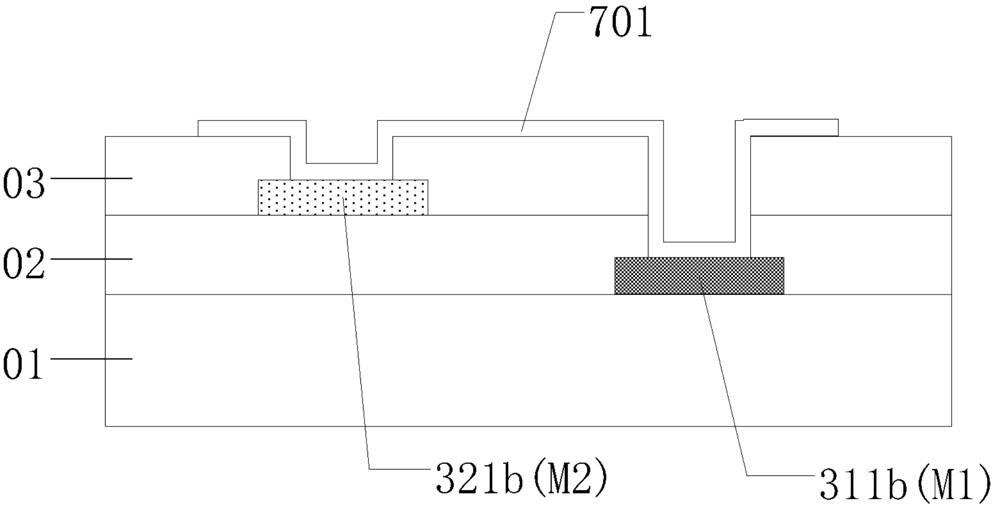
FIG. 8 shows a cross-sectional view along B-B' direction in FIG. 6 provided according to an embodiment of the present disclosure.

In the cross-sectional views shown in FIG. 3 and FIG. 5, the first conductive layer M1 is arranged on the substrate 01, and the second conductive layer M2 is on a side of the first conductive layer M1 facing away from the substrate 01. The array substrate further includes a first insulating layer 02 between the first conductive layer M1 and the second conductive layer M2, and a second insulating layer 03 covering the second conductive layer M2 and the first insulating layer 02. FIG. 6 shows an enlarged view of the area of block B in FIG. 2, and FIG. 8 shows a cross-sectional view along line B-B' in FIG. 6. Referring to FIG. 6 and FIG. 8, each second display data fan-out line segment 321*b* in the second conductive layer M2 is electrically connected to the corresponding first display data fan-out line segment 311*b* in the first conductive layer M1 through a first connecting part 701, one end of the first connecting part 701 is connected with the second display data fan-out line segment 321*b* through at least one first via hole 601 penetrating the second insulating layer 03, and the other end of first connecting part 701 is connected with the first display data fan-out line segment 311*b* through at least one second via hole 602 penetrating the first insulating layer 02 and the second insulating layer 03.

In some embodiments, as shown in FIG. 6, each second display data fan-out line segment 321*b* in the second conductive layer includes a first widening portion 501, the corresponding first display data fan-out line segment 311*b* in the first conductive layer includes a second widening portion 502, an orthographic projection of the at least one first via hole 601 on the substrate is within an orthographic projection of the first widening portion 501 on the substrate, and an orthographic projection of the at least one second via hole 602 on the substrate is within an orthographic projection of the second widening portion 502 on the substrate.

Since the lines in the fan-out area is usually very thin, it is extremely demanding to make via holes on a very thin line, which improves the manufacturing difficulty and makes it difficult to ensure the manufacturing accuracy. According to the embodiment of the disclosure, the first widening portion and the second widening portion are arranged, so that the process difficulty in manufacturing the via hole is simplified, and the manufacturing accuracy is improved.

Figure 9:
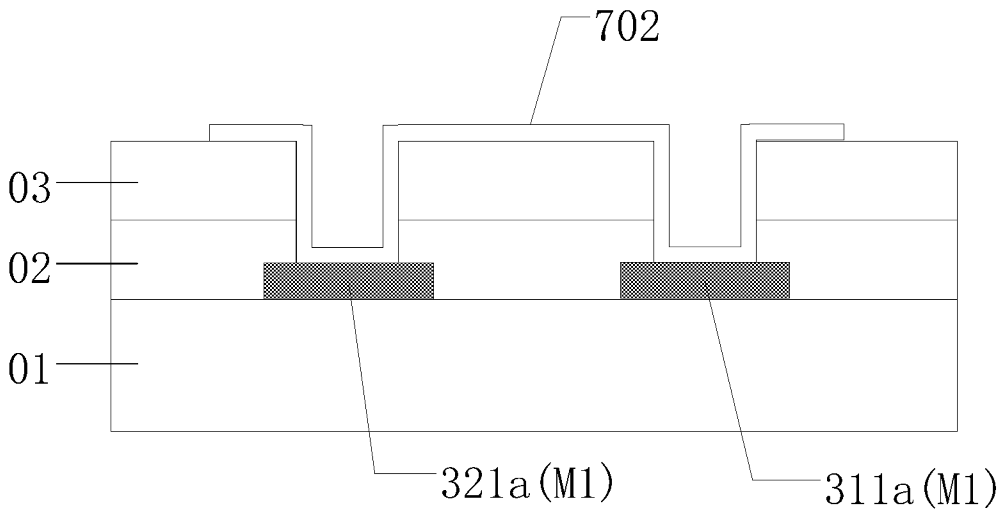
FIG. 9 shows a cross-sectional view along b-b' direction in FIG. 6 provided according to an embodiment of the present disclosure.

For the second display data fan-out line segments in the first conductive layer in the second part of the fan-out area, such as 321*a* and 321*c* in FIG. 5, they can be integrally connected with the corresponding first display data fan-out line segments in the first part of the fan-out area in a same layer. However, in this case, the resistance of the second display data fan-out line segment 321*a* or 321*c* will be quite different from that of the second display data fan-out line segment 321*b*, resulting in a sudden change in the resistance of adjacent display data lines, which is not conducive to the stable transmission of display signals. Therefore, in some embodiments of the present application, referring to FIG. 6 and FIG. 9, each second display data fan-out line segment 321*a* (or 321*c*, not labeled in FIG. 6) in the first conductive layer M1 is electrically connected to the corresponding first display data fan-out line segment 311*a* (or 311*c*, not labeled in FIG. 6) in the first conductive layer M1 through the second connecting part 702. One end of the second connecting part 702 is connected with the second display data fan-out line segment 321*a* through at least one third via hole 603 penetrating the first insulating layer 02 and the second insulating layer 03, and the other end of the second connecting part 702 is connected with the first display data fan-out line segment 311*a* through at least one fourth via hole 604 penetrating the first insulating layer 02 and the second insulating layer 03.

In some embodiments, as shown in FIG. 6, each second display data fan-out line segment 321*a* (or 321*c*, not labeled in FIG. 6) in the first conductive layer includes a third widening portion 503, and the corresponding first display data fan-out line segment 311*a* (or 311*c*, not labeled in FIG. 6) in the first conductive layer includes a fourth widening portion 504, an orthographic projection of the at least one third via hole 603 on the substrate is within an orthographic projection of the third widening portion 503 on the substrate, and an orthographic projection of the at least one fourth via hole 604 on the substrate is within an orthographic projection of the fourth widening portion 504 on the substrate.

According to the embodiment of the disclosure, the third widening portion and the fourth widening portion are arranged, so that the process difficulty in manufacturing the via hole is simplified, and the manufacturing accuracy is improved.

It should be noted that in the above embodiment, the first wiring group includes three display data lines and one touch data line, that is, the number ratio of display data lines to touch data lines in the first wiring group is 3:1, which is only exemplary. A person skilled in the art can reasonably set the number and ratio of display data lines and touch data lines in the first wiring group according to the number of display data lines and touch data lines required in actual products, and this application is not limited to this, as long as the lines in the two conductive layers can be "overlapped" or "alternately arranged" in the second part of the fan-out area.

In some embodiments, as shown in FIG. 2 and FIG. 4, the second part of the fan-out area further includes a second wiring area 325 arranged adjacent to the first wiring area 323, a plurality of second wiring groups 326 are arranged in the second wiring area 325, and each second wiring group includes two second touch data fan-out line segments 322. Only one second wiring group 326 is schematically shown in FIG. 2 and FIG. 4.

In the embodiment shown in FIG. 2 and FIG. 3, two second touch data fan-out line segments 322 in each second wiring group 326 are in the second conductive layer. In this case, the second touch data fan-out line segments in the first wiring group and the second wiring group are both in the second conductive layer, and the first touch data fan-out line segments in the first part of the fan-out area are also in the second conductive layer, and each second touch data fan-out line segment is integrally connected with the corresponding first touch data fan-out line segment in the same layer. Thus, all the touch data fan-out lines are in the second conductive layer, which can prevent the critical dimension difference between two adjacent touch data fan-out lines caused by process fluctuation of different layers being too large, thereby avoiding the problem that the resistance difference between adjacent touch data fan-out lines is too large.

In the embodiments shown in FIG. 4 and FIG. 5, two second touch data fan-out line segments 322 of each second wiring group 326 are arranged in an overlapping manner in the first conductive layer and the second conductive layer. This can further reduce the space occupied by the lines in the fan-out area, thus further reducing the size of the bottom border of the product.

Figure 7:
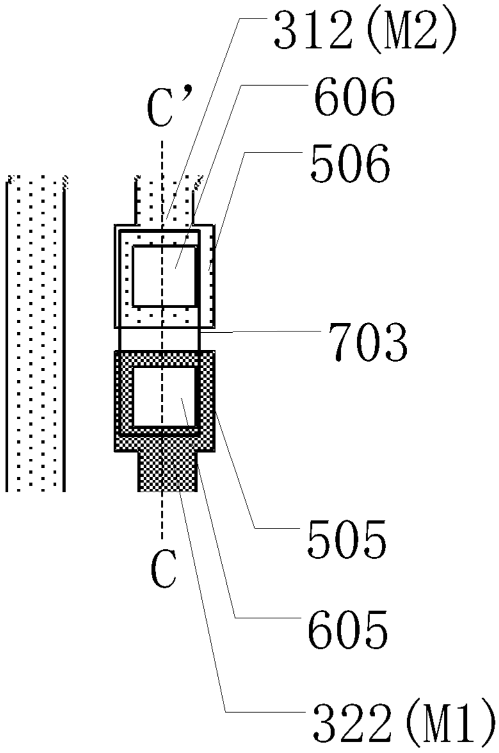
FIG. 7 shows an enlarged view of area B in FIG. 4 provided according to an embodiment of the present disclosure.
Figure 10:
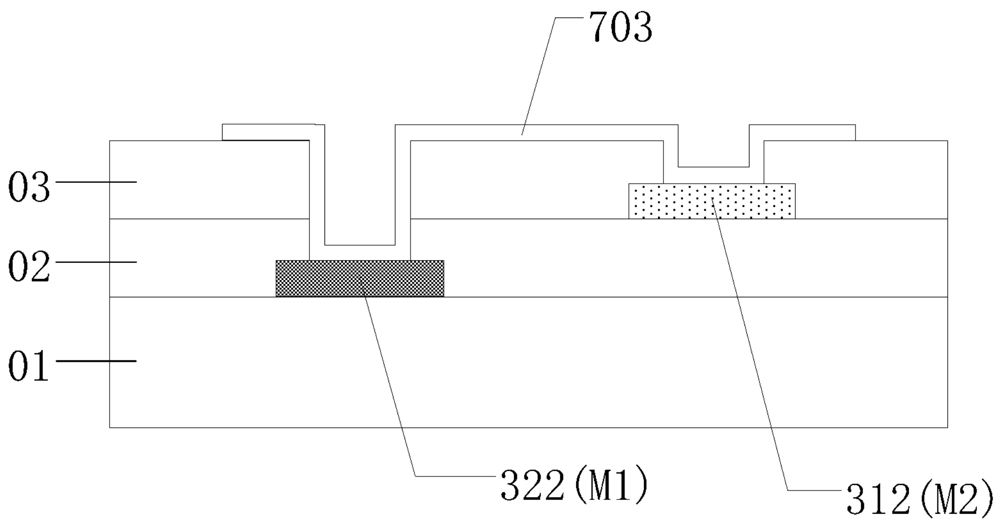
FIG. 10 shows a cross-sectional view along C-C' direction in FIG. 7 provided according to an embodiment of the present disclosure.

FIG. 7 shows an enlarged view of the area of block C in FIG. 4. Referring to FIG. 7 and FIG. 10, each second touch data fan-out line segment 322 in the first conductive layer M1 is electrically connected to the corresponding first touch data fan-out line segment 312 in the second conductive layer M2 through a third connecting part 703, one end of the third connecting part 703 is connected with the second touch data fan-out line segment 322 through at least one fifth via hole 605 penetrating the first insulating layer 02 and the second insulating layer 03, and the other end of the third connecting part 703 is connected with the first touch data fan-out line segment 312 through at least one fifth via hole 605 penetrating the second insulating layer 03

Referring to FIG. 7, each second touch data fan-out line segment 322 in the first conductive layer includes a fifth widening portion 505, and the corresponding first touch data fan-out line segment 312 in the second conductive layer includes a sixth widening portion 506, an orthographic projection of the at least one fifth via hole 605 on the substrate is within an orthographic projection of the fifth widening portion 505 on the substrate, and an orthographic projection of the at least one sixth via hole 606 on the substrate is within an orthographic projection of the sixth widening portion 506 on the substrate.

According to the embodiment of the disclosure, the fifth widening portion and the sixth widening portion are arranged, so that the process difficulty in manufacturing the via hole is simplified, and the manufacturing accuracy is improved.

Figure 11:
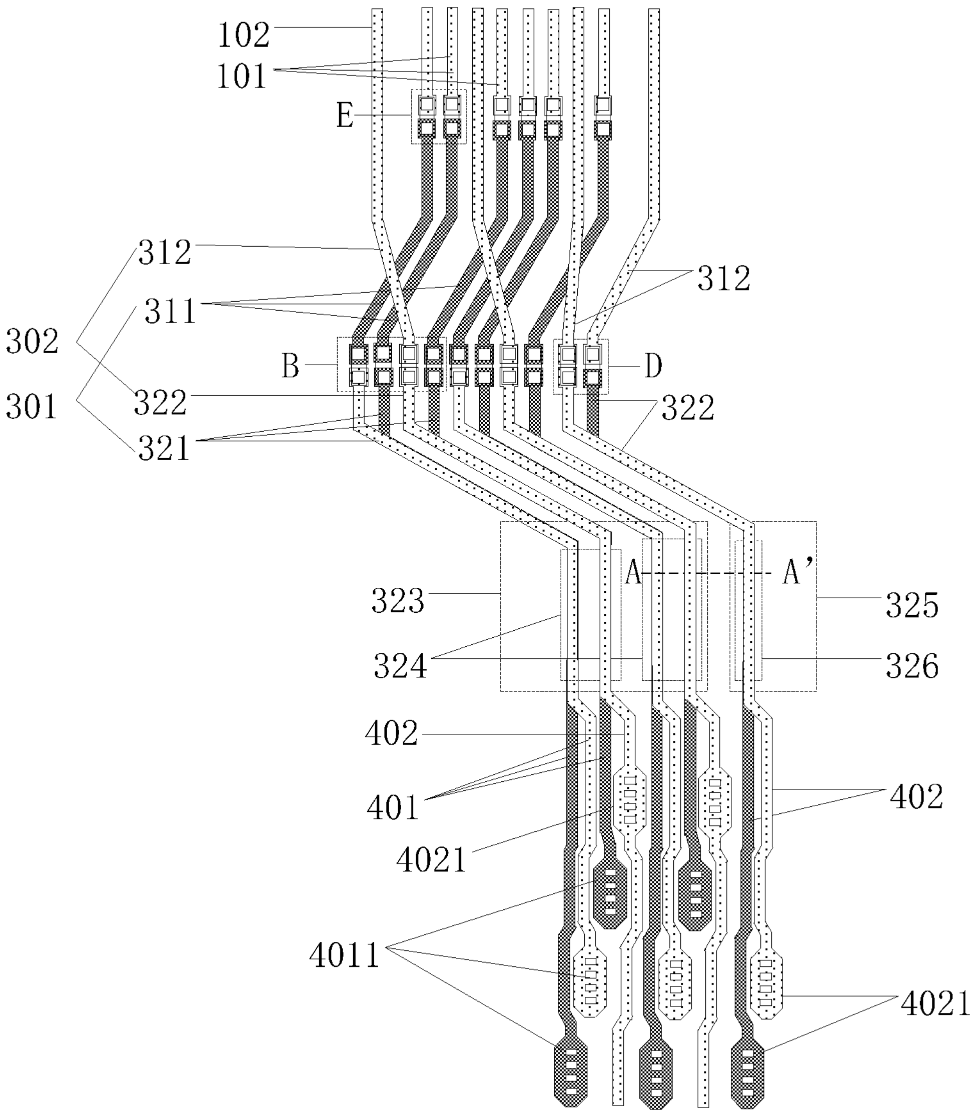
FIG. 11 shows a schematic diagram of a part of a wiring area of an array substrate provided according to another embodiment of the present disclosure.
Figure 12:
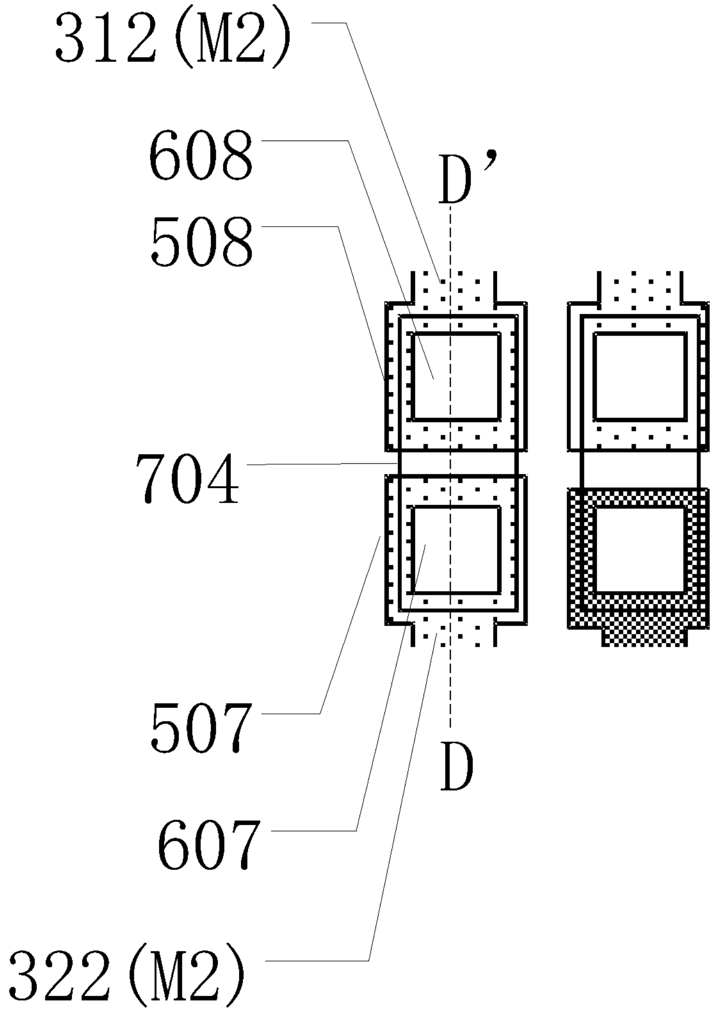
FIG. 12 shows an enlarged view of area D in FIG. 11 provided according to an embodiment of the present disclosure.
Figure 13:
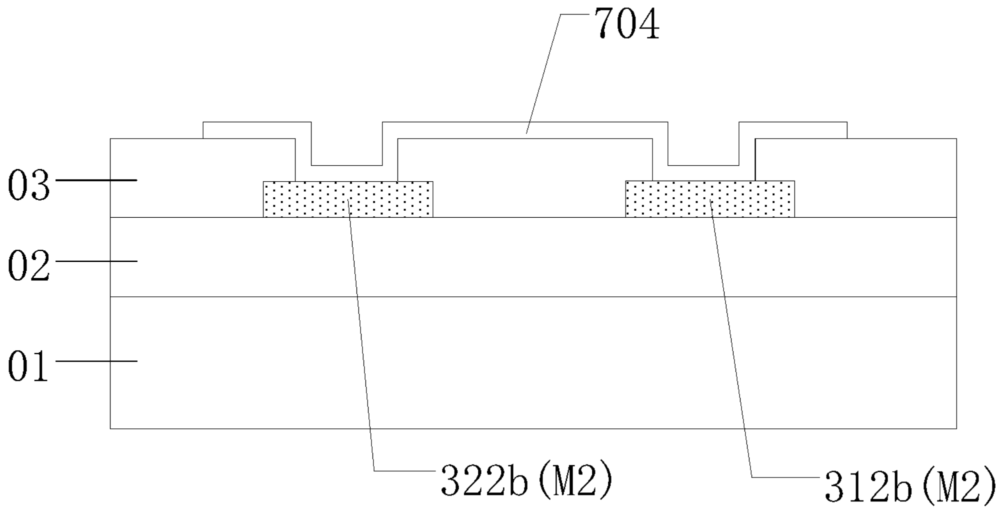
FIG. 13 shows a cross-sectional view along D-D' direction in FIG. 12 provided according to an embodiment of the present disclosure.

FIG. 11 shows a schematic diagram of a part of a wiring area of an array substrate provided according to another embodiment of the present disclosure. FIG. 12 shows an enlarged view of the area of block D in FIG. 11, and FIG. 13 shows a cross-sectional view along D-D' direction in FIG. 12. Referring to FIG. 12 and FIG. 13, each second touch data fan-out line segment 322 in the second conductive layer is electrically connected to the corresponding first touch data fan-out line segment 312 in the second conductive layer through a fourth connecting part 704, one end of the fourth connecting part 704 is connected with the second touch data fan-out line segment 322 through at least one seventh via hole 607 penetrating the second insulating layer 03, and the other end of the fourth connecting part 704 is connected with the first touch data fan-out line segment 312 through at least one eighth via hole 608 penetrating the second insulating layer 03.

Figure 14:
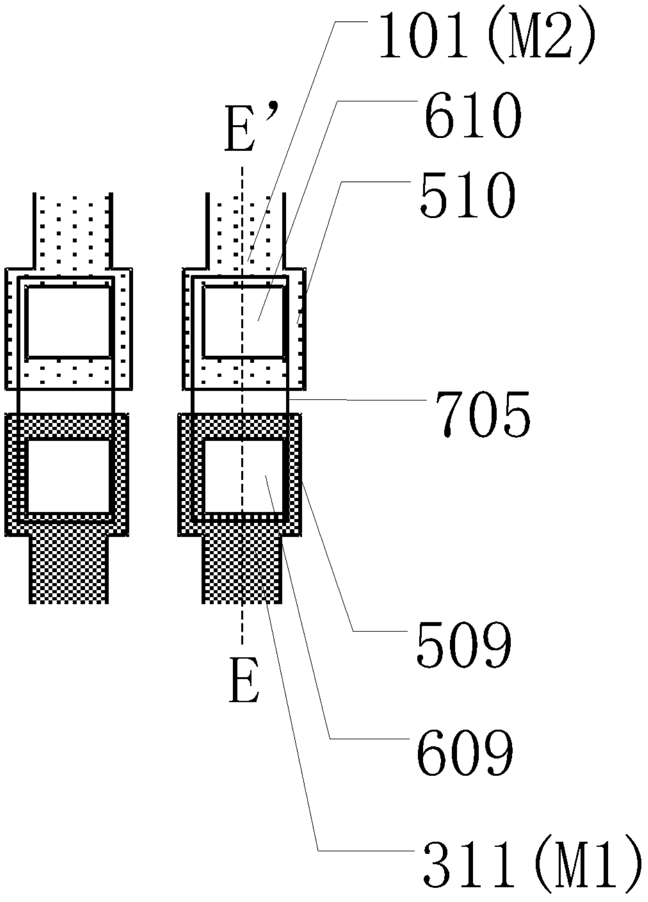
FIG. 14 shows an enlarged view of an area E in FIG. 11 provided according to an embodiment of the present disclosure.
Figure 15:
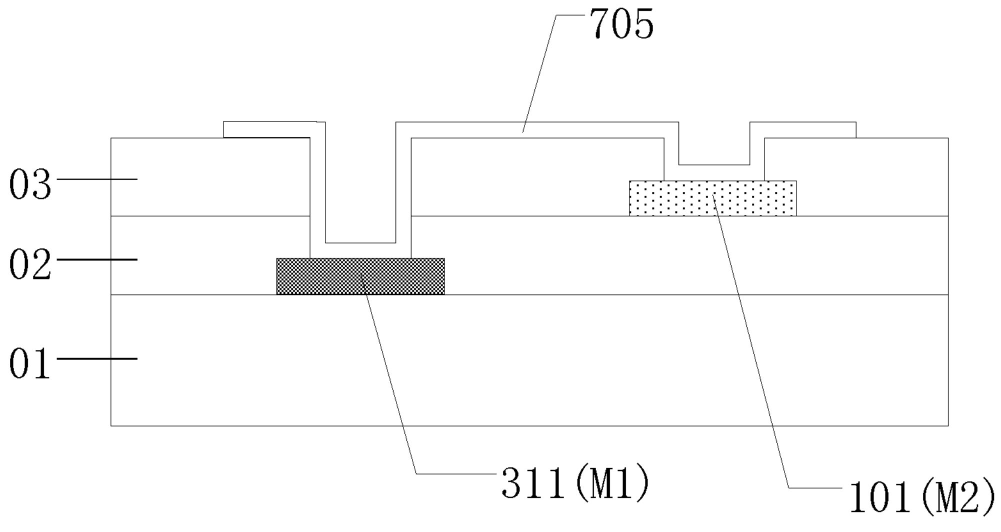
FIG. 15 shows a cross-sectional view along E-E' direction in FIG. 14 provided according to an embodiment of the present disclosure.

In some embodiments, as shown in FIG. 12, each second touch data fan-out line segment 322 in the second conductive layer includes a seventh widening portion 507, and the corresponding first touch data fan-out line segment 312 in the second conductive layer includes an eighth widening portion 508, an orthographic projection of the at least one seventh via hole 607 on the substrate is within an orthographic projection of the seventh widening portion 507 on the substrate, and an orthographic projection of the at least one eighth via hole 608 on the substrate is within an orthographic projection of the eighth widening portion 508 on the substrate. In some embodiments, in the display area, as shown in FIG. 11, both the display data lines 101 and the touch data lines 102 are in the second conductive layer. FIG. 14 shows an enlarged view of the area of block E in FIG. 11, and FIG. 15 shows a cross-sectional view along E-E' direction in FIG. 14. Referring to FIG. 14 and FIG. 15, each first display data fan-out line 311 in the first conductive layer is electrically connected to the corresponding display data line 101 in the second conductive layer through a fifth connecting part 705, one end of the fifth connecting part 705 is connected to the first display data fan-out line 311 through at least one ninth via hole 609 penetrating the first insulating layer 02 and the second insulating layer 03, and the other end of the fifth connecting part 705 is connected to the display data line 101 through at least one tenth via hole penetrating the second insulating layer 03. As shown in FIG. 11, each first touch data fan-out line segment in the second conductive layer is integrally connected with the corresponding touch data line in the same layer.

In some embodiments, as shown in FIG. 14, each first display data fan-out line segment 311 in the first conductive layer includes a ninth widening portion 509, and the corresponding display data line 101 in the second conductive layer includes a tenth widening portion 510, an orthographic projection of the at least one ninth via hole 609 on the substrate is within an orthographic projection of the ninth widening portion 509 on the substrate, and an orthographic projection of the at least one tenth via hole 610 on the substrate is within an orthographic projection of the tenth widening portion 510 on the substrate.

According to the embodiment of the disclosure, the fifth widening portion and the sixth widening portion are arranged, so that the process difficulty in manufacturing the via hole is simplified, and the manufacturing accuracy is improved.

It should be noted that in the drawings of this application, one touch data line is connected with one first touch data fan-out line segment, which is only schematic. In practice, one touch data line may also be connected with a plurality of first touch data fan-out line segments, and those skilled in the art can make reasonable design according to the actual situation.

For the sake of clarity, in FIGS. 6-10 and FIGS. 11-15, only one first via hole 601, one second via hole 602, one third via hole 603, one fourth via hole 604, one fifth via hole 605, one sixth via hole 606, one seventh via hole 607, one eighth via hole 608 and one ninth via hole 609 and one tenth via hole 610 are schematically shown, those skilled in the art can design proper number of via holes according to the actual situation.

In some embodiments, the first connecting part, the second connecting part, the third connecting part, the fourth connecting part and the fifth connecting part can be made in a same process as the common electrode or the pixel electrode of the array substrate. In this way, the manufacturing process of the common electrode or the pixel electrode can be reused, the manufacturing process is simplified, and the cost is reduced.

In some embodiments, the common electrode or pixel electrode of the array substrate can be made of transparent conductive materials, such as ITO and IZO, and in this case, the first connecting part, the second connecting part and the third connecting part can also be made of transparent conductive materials.

In the embodiments of the application, the non-display area further includes a signal input area. As shown in FIG. 2 and FIG. 4, a plurality of display signal input lines 401 and a plurality of touch signal input lines 402 are arranged in the signal input area, each display signal input line 401 is connected with a corresponding display data fan-out line 301, and each touch signal input line 402 is connected with a corresponding touch data fan-out line 302. Specifically, each display signal input line 401 is integrally connected with the second display data fan-out line segment 321 of the corresponding display data fan-out line 301 in a same layer, and each touch signal input line 402 is integrally connected with the second touch data fan-out line segment 322 of the corresponding touch data fan-out line 302 in a same layer.

Referring to FIG. 2 and FIG. 4, each display signal input line 402 may include a first bonding terminal 4011, and each touch signal input line 402 may include a second bonding terminal 4021. The orthographic projections of each first bonding terminal 4011 and each second bonding terminal 4022 on the substrate do not overlap each other. Such an arrangement facilitates corresponding connection with pins of a control chip.

In the above embodiments of the present application, the first conductive layer may be a gate layer, and the second conductive layer may be a source-drain layer. In this way, the manufacturing processes of the gate layer and the source-drain layer can be reused to manufacture the display data lines and the touch data lines, which not only simplifies the manufacturing process, but also reduces the thickness of the array substrate compared with the scheme of arranging the display data lines and the touch data lines with another separate conductive layer.

It should be noted that the term "wiring" in this application is a general term for various data lines, fan-out lines and signal input lines. In some cases, the word "wiring" is used only for the convenience of description. In specific contexts, those skilled in the art can clearly know which data lines, fan-out lines and signal input lines it refers to. In addition, in this application, when referring to the "electrical connection" of two lines or line segments, it includes not only the direct integral connection of two lines or line segments in the same layer, but also the connection of conductive lines or line segments in different layers through via holes, and other connection methods not described in this application.

According to another aspect of the present disclosure, a touch display device is provided, which includes an array substrate described in any of the previous embodiments and a control chip, wherein pins of the control chip are connected with corresponding first bonding terminals and second bonding terminals in the signal input area. The number of control chips is not specifically limited in this application, and those skilled in the art can arrange them according to actual needs.

In some embodiments, the touch display device can be liquid crystal display devices, including but not limited to mobile phones, tablet computers, televisions, monitors, notebook computers, digital photo borders, navigators, e-books and other products or components with display functions.

Since the touch display device can have basically the same technical effect as the array substrate described in the previous embodiments, for the sake of brevity, the technical effect of the touch display device is not repeated here.

The inventor applied the inventive concept of this application to actual products, and two products are briefly introduced below.

Touch Display Device 1

The number of display signal lines is 4800, the number of touch signal lines is 2560, and a ratio of the number of display signal lines to the number of touch signal lines is 15:8. In the first wiring area, the ratio of the number of display signal lines to the number of touch signal lines is 3:1, and the redundant touch signal lines are arranged in the second wiring area. The product is driven by two control chips, and the second wiring area can be arranged between the two control chips. The wiring carried out in the manner described in the embodiment of the application can effectively reduce the wiring space in the fan-out area. The bottom border can be reduced by about 0.25~0.35 mm with the same wiring cycle of the fan-out area.

Touch Display Device 2

The number of display signal lines is 3600, the number of touch signal lines is 1560, and a ratio of the number of display signal lines to the number of touch signal lines is 30:13. In the first wiring area, the ratio of the number of display signal lines to the number of touch signal lines is 3:1, and the redundant touch signal lines are arranged in the second wiring area. The product is driven by two control chips, and the second wiring area can be arranged between the two control chips. The wiring carried out in the manner described in the embodiment of the application can effectively reduce the wiring space in the fan-out area. The bottom border can be reduced by about 0.25~0.35 mm with the same wiring cycle of the fan-out area.

In the drawings, the thickness of areas and layers may be exaggerated for clarity. In the drawings, the same reference numerals denote the same or similar structures, and therefore their detailed description is omitted. The described features, structures, or characteristics may be combined in any suitable manner in one or more embodiments. In the description, numerous specific details are provided to give a thorough understanding of the embodiments of the present disclosure. However, those skilled in the art will realize that the technical solution of the present disclosure can be practiced without one or more of the specific details, or other methods, components, materials, etc. can be adopted. In other instance, well-known structures, material or operations are not shown or described in detail to avoid obscuring that main technical concept of the present disclosure.

Spatial relative terms such as "row", "column", "up", "down", "left" and "right" can be used in the disclosure to describe the relationship between one element or feature and another element or feature as illustrated in the figures. It will be understood that these spatially relative terms are intended to cover different orientations of devices in use or operation other than those depicted in the figures. For example, if the device in the figure is turned over, elements described as "under other elements or features" or "below other elements or features" will be oriented as "above other elements or features" and elements described as "to the left of other elements" will be oriented as "to the right of other elements". Thus, the exemplary term "under" can cover both orientations of "above" and "under", and the exemplary term "to the left of" can cover both orientations of "to the left" and "to the right". Devices can be oriented in other ways (rotated by 90 degrees or in other orientations) and the spatial relative descriptors used herein should be interpreted accordingly. In addition, it will also be understood that when a layer is referred to as "between two layers", it may be the only layer between the two layers, or there may be one or more intermediate layers.

In the description of this specification, descriptions referring to the terms "one embodiment", "another embodiment" and the like mean that a specific feature, structure, material or characteristic described in connection with this embodiment is included in at least one embodiment of this disclosure. In this specification, the schematic expressions of the above terms are not necessarily aimed at the same embodiment or example. Moreover, the specific features, structures, materials or characteristics described may be combined in any one or more embodiments or examples in a suitable manner. In addition, those skilled in the art can combine different embodiments or examples and features of different embodiments or examples described in this specification without contradicting each other. In addition, it should be noted that in this specification, the terms "first" and "second" are only used for descriptive purposes, and cannot be understood as indicating or implying relative importance or implicitly indicating the number of indicated technical features.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

What is claimed is:

1. An array substrate, comprising: a display area and a non-display area at least partially surrounding the display area, the non-display area comprising a fan-out area and a signal input area, and the fan-out area being between the display area and the signal input area, wherein the display area is provided with a plurality of display data lines and a plurality of touch data lines, the fan-out area is provided with a plurality of display data fan-out lines and a plurality of touch data fan-out lines, each display data fan-out line is connected with a corresponding display data line, and each touch data fan-out line is connected with a corresponding touch data line;

wherein the fan-out area comprises a first part and a second part which are adjacently distributed in a direction from the display area to the signal input area, in the first part of the fan-out area, each display data fan-out line comprises a first display data fan-out line segment connected with a corresponding display data line, each touch data fan-out line comprises a first touch data fan-out line segment connected with a corresponding touch data line, the first display data fan-out line segment is in a first conductive layer, and the first touch data fan-out line segment is in a second conductive layer electrically insulated from the first conductive layer; and wherein in the display area, the plurality of display data lines and the plurality of touch data lines are in the second conductive layer.

2. The array substrate according to claim 1, further comprising a substrate, wherein the first conductive layer is arranged on the substrate, the second conductive layer is on a side of the first conductive layer facing away from the substrate, and the array substrate further comprises a first insulating layer between the first conductive layer and the second conductive layer, and a second insulating layer covering the second conductive layer and the first insulating layer, wherein each first display data fan-out line segment in the first conductive layer is electrically connected to a corresponding display data line in the second conductive layer through a fifth connecting part, one end of the fifth connecting part is connected with the first display data fan-out line segment through at least one ninth via hole penetrating the first insulating layer and the second insulating layer, and the other end of the fifth connecting part is connected with the display data line through at least one tenth via hole penetrating the second insulating layer, and wherein each first touch data fan-out line segment in the second conductive layer is integrally connected with a corresponding touch data line in a same layer.

3. The array substrate according to claim 2, wherein each first display data fan-out line segment in the first conductive layer comprises a ninth widening portion, the corresponding display data line in the second conductive layer comprises a tenth widening portion, an orthographic projection of the at least one ninth via hole on the substrate is within an orthographic projection of the ninth widening portion on the substrate, and an orthographic projection of the at least one tenth via hole on the substrate is within an orthographic projection of the tenth widening portion on the substrate.

4. The array substrate according to claim 2, wherein in the second part of the fan-out area, each display data fan-out line comprises a second display data fan-out line segment electrically connected with the first display data fan-out line segment, each touch data fan-out line comprises a second touch data fan-out line segment electrically connected with the first touch data fan-out line segment, the second part of the fan-out area comprises a first wiring area, a plurality of first wiring groups are arranged in the first wiring area, each first wiring group comprises a plurality of second display data fan-out line segments and at least one second touch data fan-out line segment, wherein the at least one second touch data fan-out line segment is in the second conductive layer, some of the plurality of second display data fan-out line segments are in the first conductive layer, and others of the plurality of second display data fan-out line segments are in the second conductive layer.

5. The array substrate according to claim 4, wherein the second display data fan-out line segment or the second touch data fan-out line segment in the second conductive layer overlaps or is alternately arranged with the corresponding second display data fan-out line segment in the first conductive layer.

6. The array substrate according to claim 5, further comprising a substrate, wherein the first conductive layer is arranged on the substrate, and the second conductive layer is on a side of the first conductive layer facing away from the substrate, and the array substrate further comprises a first insulating layer between the first conductive layer and the second conductive layer, and a second insulating layer covering the second conductive layer and the first insulating layer, wherein each second display data fan-out line segment in the second conductive layer is electrically connected to a corresponding first display data fan-out line segment in the first conductive layer through a first connecting part, one end of the first connecting part is connected with the second display data fan-out line segment through at least one first via hole penetrating the second insulating layer, and the other end of the first connecting part is connected with the first display data fan-out line segment through at least one second via hole penetrating the first insulating layer and the second insulating layer.

7. The array substrate according to claim 6, wherein each second display data fan-out line segment in the second conductive layer comprises a first widening portion, a corresponding first display data fan-out line segment in the first conductive layer comprises a second widening portion, an orthographic projection of the at least one first via hole on the substrate is within an orthographic projection of the first widening portion on the substrate, and an orthographic projection of the at least one second via hole on the substrate is within an orthographic projection of the second widening portion on the substrate.

8. The array substrate according to claim 6, wherein each second display data fan-out line segment in the first conductive layer is electrically connected to a corresponding first display data fan-out line segment in the first conductive layer through a second connecting part, one end of the second connecting part is connected with the second display data fan-out line segment through at least one third via hole penetrating the first insulating layer and the second insulating layer, and the other end of the second connecting part is connected with the first display data fan-out line segment through at least one fourth via hole penetrating the first insulating layer and the second insulating layer.

9. The array substrate according to claim 8, wherein each second display data fan-out line segment in the first conductive layer comprises a third widening portion, the corresponding first display data fan-out line segment in the first conductive layer comprises a fourth widening portion, an orthographic projection of the at least one third via hole on the substrate is within an orthographic projection of the third widening portion on the substrate, and an orthographic projection of the at least one fourth via hole on the substrate is within an orthographic projection of the fourth widening portion on the substrate.

10. The array substrate according to claim 8, wherein the second part of the fan-out area further comprises a second wiring area arranged adjacent to the first wiring area, a plurality of second wiring groups are arranged in the second wiring area, and each second wiring group comprises at least two second touch data fan-out line segments.

11. The array substrate according to claim 10, wherein two second touch data fan-out line segments in each second wiring group are in the second conductive layer.

12. The array substrate according to claim 11, wherein each second touch data fan-out line segment is integrally connected with a corresponding first touch data fan-out line segment in a same layer.

13. The array substrate according to claim 10, wherein two second touch data fan-out line segments of each second wiring group are overlapped or alternately arranged in the first conductive layer and the second conductive layer.

14. The array substrate according to claim 13, wherein each second touch data fan-out line segment in the first conductive layer is electrically connected to a corresponding first touch data fan-out line segment in the second conductive layer through a third connecting part, one end of the third connecting part is connected with the second touch data fan-out line segment through at least one fifth via hole penetrating the first insulating layer and the second insulating layer, and the other end of the third connecting part is connected with the first touch data fan-out line segment through at least one sixth via hole penetrating the second insulating layer.

15. The array substrate according to claim 14, wherein each second touch data fan-out line segment in the first conductive layer comprises a fifth widening portion, the corresponding first touch data fan-out line segment in the second conductive layer comprises a sixth widening portion, an orthographic projection of the at least one fifth via hole on the substrate is within an orthographic projection of the fifth widening portion on the substrate, and an orthographic projection of the at least one sixth via hole on the substrate is within an orthographic projection of the sixth widening portion on the substrate.

16. The array substrate according to claim 14, wherein each second touch data fan-out line segment in the second conductive layer is electrically connected to a corresponding first touch data fan-out line segment in the second conductive layer through a fourth connecting part, one end of the fourth connecting part is connected with the second touch data fan-out line segment through at least one seventh via hole penetrating the second insulating layer, and the other end of the fourth connecting part is connected with the first touch data fan-out line segment through at least one eighth via hole penetrating the second insulating layer.

17. The array substrate according to claim 16, wherein each second touch data fan-out line segment in the second conductive layer comprises a seventh widening portion, the corresponding first touch data fan-out line segment in the second conductive layer comprises an eighth widening portion, an orthographic projection of the at least one seventh via hole on the substrate is within an orthographic projection of the seventh widening portion on the substrate, and an orthographic projection of the at least one eighth via hole on the substrate is within an orthographic projection of the eighth widening portion on the substrate.

18. The array substrate according to claim 16, further comprising a common electrode, wherein the first connecting part, the second connecting part, the third connecting part, the fourth connecting part and the fifth connecting part are made in a same process as the common electrode.

19. The array substrate according to claim 16, further comprising a pixel electrode, wherein the first connecting part, the second connecting part, the third connecting part, the fourth connecting part and the fifth connecting part are made in a same process as the pixel electrode.

20. The array substrate according to claim 4, wherein a plurality of display signal input lines and a plurality of touch signal input lines are arranged in the signal input area, each display signal input line is connected with a corresponding display data fan-out line, and each touch signal input line is connected with a corresponding touch data fan-out line.

21. The array substrate according to claim 20, wherein each display signal input line is integrally connected with the second display data fan-out line segment of the corresponding display data fan-out line in a same layer, and each touch signal input line is integrally connected with the second touch data fan-out line segment of the corresponding touch data fan-out line in a same layer.

22. The array substrate according to claim 20, wherein each display signal input line comprises a first bonding terminal, each touch signal input line comprises a second bonding terminal, and orthographic projections of each first bonding terminal and each second bonding terminal on the substrate do not overlap each other.

23. The array substrate according to claim 1, wherein the first conductive layer is a gate layer and the second conductive layer is a source-drain layer.

24. A touch display device, comprising an array substrate according to claim 1 and a control chip, wherein pins of the control chip are connected with corresponding first bonding terminals and second bonding terminals in the signal input area.

* * * * *